(12) United States Patent
Schardt et al.

(10) Patent No.: US 7,537,374 B2
(45) Date of Patent: May 26, 2009

(54) EDGE-LIT BACKLIGHT HAVING LIGHT RECYCLING CAVITY WITH CONCAVE TRANSFLECTOR

(75) Inventors: Craig R. Schardt, St. Paul, MN (US); D. Scott Thompson, Woodbury, MN (US); John A. Wheatley, Lake Elmo, MN (US); Dong Lu, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 139 days.

(21) Appl. No.: 11/466,628

(22) Filed: Aug. 23, 2006

(65) Prior Publication Data

US 2007/0047262 A1 Mar. 1, 2007

Related U.S. Application Data

(60) Provisional application No. 60/711,520, filed on Aug. 27, 2005.

(51) Int. Cl.
*F21S 13/14* (2006.01)

(52) U.S. Cl. .................. 362/623; 362/600; 362/612; 362/247

(58) Field of Classification Search .............. 362/609, 362/611, 612, 621–623, 561, 600, 247
See application file for complete search history.

(56) References Cited

U.S. PATENT DOCUMENTS

| | | | |
|---|---|---|---|
| 3,532,871 A | 10/1970 | Shipman | |
| 4,241,980 A | 12/1980 | Mihalakis et al. | |
| 4,349,598 A | 9/1982 | White | |
| 4,561,044 A | 12/1985 | Ogura et al. | |

(Continued)

FOREIGN PATENT DOCUMENTS

EP 1 486 818 12/2004

(Continued)

OTHER PUBLICATIONS

U.S. Application entitled "Direct Lit Backlight with Light Recycling and Source Polarizers", filed Feb. 24, 2005, having U.S. Appl. No. 11/064,685.

(Continued)

*Primary Examiner*—Laura Tso
(74) *Attorney, Agent, or Firm*—Jay R. Pralle (57) ABSTRACT

An edge-lit backlight having a light recycling cavity with concave transflector is disclosed. The edge-lit backlight has an output area and includes a back reflector facing the output area of the backlight. The backlight further includes a transflector that partially transmits and partially reflects incident light, the transflector being shaped to form a concave structure facing the back reflector to provide one or more recycling cavities therebetween, where the one or more recycling cavities substantially fill the output area of the backlight. The backlight further includes at least one light source positioned adjacent a first edge of the backlight. The at least one light source is operable to inject light into the one or more recycling cavities through an input surface of the one or more recycling cavities, where the input surface is substantially orthogonal to the output area, and where the at least one concave structure converges with the back reflector in a direction distal from the input surface.

21 Claims, 7 Drawing Sheets

U.S. PATENT DOCUMENTS

| | | | |
|---|---|---|---|
| 4,588,258 A | 5/1986 | Hoopman | |
| 4,775,219 A | 10/1988 | Appeldorn et al. | |
| 4,850,665 A | 7/1989 | Whitehead | |
| 4,906,070 A | 3/1990 | Cobb, Jr. | |
| 4,938,563 A | 7/1990 | Nelson et al. | |
| 4,952,023 A | 8/1990 | Bradshaw et al. | |
| 5,122,902 A | 6/1992 | Benson | |
| 5,136,479 A | 8/1992 | Ruffner | |
| 5,138,488 A | 8/1992 | Szczech | |
| 5,186,530 A | 2/1993 | Whitehead | |
| 5,195,818 A | 3/1993 | Simmons et al. | |
| 5,309,544 A | 5/1994 | Saxe | |
| 5,337,068 A | 8/1994 | Stewart et al. | |
| 5,339,382 A | 8/1994 | Whitehead | |
| 5,375,043 A | 12/1994 | Tokunaga | |
| 5,396,350 A | 3/1995 | Beeson et al. | |
| 5,450,285 A | 9/1995 | Schlemmer | |
| 5,485,038 A | 1/1996 | Licari et al. | |
| 5,598,281 A | 1/1997 | Zimmerman et al. | |
| 5,638,084 A | 6/1997 | Kalt | |
| 5,676,453 A | 10/1997 | Parkyn, Jr. et al. | |
| 5,751,388 A | 5/1998 | Larson | |
| 5,793,456 A | 8/1998 | Broer et al. | |
| 5,825,543 A | 10/1998 | Ouderkirk et al. | |
| 5,828,488 A | 10/1998 | Ouderkirk et al. | |
| 5,840,405 A | 11/1998 | Shusta et al. | |
| 5,845,038 A | 12/1998 | Lundin et al. | |
| 5,867,316 A | 2/1999 | Carlson et al. | |
| 5,882,774 A | 3/1999 | Jonza et al. | |
| 5,889,615 A | 3/1999 | Dreyer et al. | |
| 5,899,552 A | 5/1999 | Yokoyama et al. | |
| 5,948,488 A | 9/1999 | Marecki et al. | |
| 5,959,316 A | 9/1999 | Lowery | |
| 6,007,209 A | 12/1999 | Pelka | |
| 6,079,844 A | 6/2000 | Whitehead et al. | |
| 6,096,247 A | 8/2000 | Ulsh et al. | |
| 6,101,032 A | 8/2000 | Wortman et al. | |
| 6,111,696 A | 8/2000 | Allen et al. | |
| 6,122,103 A | 9/2000 | Perkins et al. | |
| 6,164,782 A | 12/2000 | Pojar | |
| 6,241,363 B1 | 6/2001 | Lee | |
| 6,277,471 B1 | 8/2001 | Tang | |
| 6,280,822 B1 | 8/2001 | Smith et al. | |
| 6,287,670 B1 | 9/2001 | Benson et al. | |
| 6,317,263 B1 | 11/2001 | Moshrefzadeh et al. | |
| 6,330,111 B1 | 12/2001 | Myers | |
| 6,331,915 B1 | 12/2001 | Myers | |
| 6,354,709 B1 | 3/2002 | Campbell et al. | |
| 6,367,941 B2 | 4/2002 | Lea et al. | |
| 6,416,201 B1 | 7/2002 | Strand et al. | |
| 6,473,554 B1 | 10/2002 | Pelka et al. | |
| 6,504,649 B1 | 1/2003 | Myers | |
| 6,505,959 B2 | 1/2003 | Masaki et al. | |
| 6,568,822 B2 | 5/2003 | Boyd et al. | |
| 6,582,103 B1 | 6/2003 | Popovich et al. | |
| 6,598,998 B2 | 7/2003 | West et al. | |
| 6,604,839 B2 | 8/2003 | Coleman et al. | |
| 6,612,723 B2 | 9/2003 | Futhey et al. | |
| 6,655,810 B2 | 12/2003 | Hayashi et al. | |
| 6,674,096 B2 | 1/2004 | Sommers | |
| 6,700,716 B2 | 3/2004 | Sejkora | |
| 6,709,122 B2 | 3/2004 | Adachi et al. | |
| 6,752,505 B2 | 6/2004 | Parker et al. | |
| 6,759,113 B1 | 7/2004 | Tang | |
| 6,762,743 B2 | 7/2004 | Yoshihara et al. | |
| 6,764,096 B2 | 7/2004 | Quioc | |
| 6,767,609 B2 | 7/2004 | Aeling et al. | |
| 6,771,335 B2 | 8/2004 | Kimura et al. | |
| 6,805,468 B2 * | 10/2004 | Itoh et al. | 362/362 |
| 6,827,456 B2 | 12/2004 | Parker et al. | |
| 6,843,582 B2 | 1/2005 | Chang | |
| 6,845,212 B2 | 1/2005 | Gardiner et al. | |
| 6,846,089 B2 | 1/2005 | Stevenson et al. | |
| 6,874,902 B2 | 4/2005 | Yamashita et al. | |
| 6,964,497 B2 | 11/2005 | Greiner | |
| 6,974,229 B2 | 12/2005 | West et al. | |
| 7,263,268 B2 * | 8/2007 | Inditsky | |
| 2001/0021110 A1 | 9/2001 | Nakayama | |
| 2002/0080598 A1 | 6/2002 | Parker et al. | |
| 2002/0097354 A1 | 7/2002 | Greiner | |
| 2002/0159019 A1 | 10/2002 | Pokorny et al. | |
| 2002/0163791 A1 | 11/2002 | Hoelen et al. | |
| 2002/0190406 A1 | 12/2002 | Merrill et al. | |
| 2003/0035231 A1 | 2/2003 | Epstein et al. | |
| 2003/0039030 A1 | 2/2003 | Myers | |
| 2003/0058553 A1 | 3/2003 | Epstein et al. | |
| 2003/0076034 A1 | 4/2003 | Marshall et al. | |
| 2003/0107892 A1 | 6/2003 | Yao | |
| 2004/0001330 A1 | 1/2004 | Kang et al. | |
| 2004/0012943 A1 * | 1/2004 | Toyooka | 362/31 |
| 2004/0041965 A1 | 3/2004 | Liu | |
| 2004/0070100 A1 | 4/2004 | Strobel et al. | |
| 2004/0080938 A1 | 4/2004 | Holman et al. | |
| 2004/0093779 A1 | 5/2004 | Blach | |
| 2004/0114343 A1 | 6/2004 | Ho | |
| 2004/0174717 A1 | 9/2004 | Adachi et al. | |
| 2004/0183787 A1 | 9/2004 | Geaghan et al. | |
| 2004/0218388 A1 | 11/2004 | Suzuki | |
| 2004/0218390 A1 | 11/2004 | Holman et al. | |
| 2004/0228106 A1 | 11/2004 | Stevenson et al. | |
| 2004/0228107 A1 | 11/2004 | Lee et al. | |
| 2004/0233665 A1 | 11/2004 | West et al. | |
| 2004/0262623 A1 | 12/2004 | You | |
| 2005/0001537 A1 | 1/2005 | West et al. | |
| 2005/0002205 A1 | 1/2005 | Yu et al. | |
| 2005/0024754 A1 | 2/2005 | Epstein et al. | |
| 2005/0063063 A1 | 3/2005 | Ashdown | |
| 2005/0073070 A1 | 4/2005 | Getschel et al. | |
| 2005/0094401 A1 | 5/2005 | Magarill | |
| 2005/0111241 A1 | 5/2005 | Parker | |
| 2005/0122591 A1 | 6/2005 | Parker et al. | |
| 2005/0156495 A1 | 7/2005 | Tomoda et al. | |
| 2005/0243576 A1 | 11/2005 | Park et al. | |
| 2005/0265029 A1 | 12/2005 | Epstein et al. | |
| 2005/0280752 A1 | 12/2005 | Kim et al. | |
| 2006/0055627 A1 | 3/2006 | Wilson | |
| 2006/0072313 A1 | 4/2006 | Magarill | |
| 2006/0072340 A1 * | 4/2006 | Liao et al. | |
| 2006/0082698 A1 | 4/2006 | Ko et al. | |
| 2006/0082700 A1 | 4/2006 | Gehlsen et al. | |
| 2006/0092490 A1 | 5/2006 | McCollum et al. | |
| 2006/0131596 A1 | 6/2006 | Ouderkirk et al. | |
| 2006/0131601 A1 | 6/2006 | Ouderkirk et al. | |
| 2006/0131602 A1 | 6/2006 | Ouderkirk et al. | |
| 2006/0158080 A1 * | 7/2006 | Nakano et al. | 313/113 |
| 2006/0262554 A1 * | 11/2006 | Mok et al. | 362/555 |
| 2006/0290844 A1 | 12/2006 | Epstein et al. | |

FOREIGN PATENT DOCUMENTS

| | | |
|---|---|---|
| EP | 1 496 489 | 1/2005 |
| EP | 1 550 886 | 7/2005 |
| GB | 2 267 378 | 12/1993 |
| JP | 2003-36713 | 3/1991 |
| JP | 2002-244572 | 8/2002 |
| JP | 2004-055327 | 2/2004 |
| JP | 2004-109644 | 4/2004 |
| JP | 2004/221390 | 8/2004 |
| JP | 2004/325958 | 11/2004 |
| JP | 2005/100837 | 4/2005 |
| JP | 2006/32103 | 2/2006 |
| KR | 1020040061959 | 7/2004 |
| KR | 10-2004-0083891 | 10/2004 |
| KR | 10-2006-0000765 | 1/2006 |

| WO | 99/42861 | 8/1999 |
| WO | 2005/003851 | 1/2005 |
| WO | 2005/031483 | 4/2005 |
| WO | 2005/073622 | 8/2005 |
| WO | 2005/120791 | 12/2005 |

OTHER PUBLICATIONS

U.S. Application entitled "Method of Forming Direct-lit Backlights having Light Recycling Cavity with Concave Transflector", filed Aug. 27, 2005, having U.S. Appl. No. 60/711,523.

U.S. Application entitled "Methods of Forming Direct-lit Backlights having Light Recycling Cavity with Concave Transflector," filed Aug. 23, 2006, having U.S. Appl. No. 11/466,787.

U.S. Application entitled "Illumination Assembly and System," filed Oct. 21, 2005, having U.S. Appl. No. 60/729,370.

U.S. Application entitled "Illumination Assembly and System," filed Aug. 25, 2006, having U.S. Appl. No. 11/467,230.

U.S. Application entitled "Direct-lit Backlight having Light Sources with Bifunctional Diverters", filed Aug. 27, 2005, having U.S. Appl. No. 60/711,522.

U.S. Application entitled "Direct-lit Backlight having Light Sources with Bifunctional Diverters," filed Jul. 20, 2006, having U.S. Appl. No. 11/458,891.

U.S. Application entitled "Illumination Assembly and System Using Same", filed Aug. 27, 2005, having U.S. Appl. No. 60/711,519.

U.S. Application entitled "Color Mixing Illumination Assembly and System using Same", filed Aug. 27, 2005, having U.S. Appl. No. 60/711,551.

U.S. Application entitled "Illumination Assembly and System using Same", filed Sep. 2, 2005, having U.S. Appl. No. 60/714,068.

U.S. Application entitled "Color Mixing Illumination Assembly and System using Same", filed Sep. 2, 2005, having U.S. Appl. No. 60/714,072.

U.S. Application entitled "Direct-lit Backlight Having Light Recycling Cavity with Concave Transflector," filed Aug. 27, 2005, having U.S. Appl. No. 11/212,166.

Brochure "3M™ Image Directing Film (IDF) II," © 3M, 1996.

Brochure "3M™ Diffusing Film Alternative (DFA)," © 3M, St. Paul, MN (1996).

Brochure "3M™ Transmissive Right Angle Film (TRAF) II," © 3M, St. Paul, MN (1996).

Brochure "3M™ Brightness Enhancement Film (BEF) I," © 3M, St. Paul, MN (1996).

Brochure "Callism® Prism," EFUN Technology Co., Ltd., Tainan, Taiwan, no date.

U.S. Application entitled "Edge-lit Backlight having Light Recycling Cavity with Concave Transflector", filed Aug. 27, 2005, having U.S. Appl. No. 60/711,520.

* cited by examiner

EDGE-LIT BACKLIGHT HAVING LIGHT RECYCLING CAVITY WITH CONCAVE TRANSFLECTOR

CROSS REFERENCE TO RELATED APPLICATION

This application claims the benefit of U.S. Provisional Patent Application No. 60/711,520, filed Aug. 27, 2005, the disclosure of which is incorporated by reference herein in its entirety.

FIELD OF THE DISCLOSURE

The present disclosure relates to backlights, particularly edge-lit backlights, as well as to components used in backlights, systems that use backlights, and methods of making and using backlights. The disclosure is particularly well suited to backlights used in liquid crystal display (LCD) devices and similar displays, as well as to backlights that utilize LEDs as a source of illumination.

BACKGROUND

Recent years have seen tremendous growth in the number and variety of display devices available to the public. Computers (whether desktop, laptop, or notebook), personal digital assistants (PDAs), mobile phones, and thin LCD TVs are but a few examples. Although some of these devices can use ordinary ambient light to view the display, most include a light panel referred to as a backlight to make the display visible.

Many such backlights fall into the categories of "edge-lit" or "direct-lit." These categories differ in the placement of the light sources relative to the output area of the backlight, where the output area defines the viewable area of the display device. In edge-lit backlights, one or more light sources are disposed along an outer border or edge of the backlight construction outside the zone corresponding to the output area. The light sources typically emit light into a light guide, which has length and width dimensions on the order of the output area and from which light is extracted to illuminate the output area. In direct-lit backlights, an array of light sources is disposed directly behind the output area, and a diffuser is placed in front of the light sources to provide a more uniform light output. Some direct-lit backlights also incorporate an edge-mounted light, and are thus illuminated with a combination of direct-lit and edge-lit illumination.

One important aspect of an edge-lit backlight is that the light illuminating the display should be uniformly bright. Illuminance uniformity is particularly a problem when the light sources used at the edge of the backlight are point sources, e.g., light emitting diodes (LEDs). In such cases, the backlight is required to spread the light across the display panel so that the displayed image lacks dark areas. In addition, in some applications, the display is illuminated with light from a number of different LEDs that produce light of different colors. Because the human eye more easily discerns variations in color than in brightness, it can be difficult to effectively mix light sources that produce different colors to provide white illumination light to the display. It is important in these situations that the light from the different LEDs be mixed so that the color, as well as the brightness, are uniform across the displayed image.

BRIEF SUMMARY

In one aspect, the present disclosure provides an edge-lit backlight having an output area. The edge-lit backlight includes a back reflector facing the output area of the backlight, and a transflector that partially transmits and partially reflects incident light, the transflector being shaped to form at least one concave structure facing the back reflector to provide one or more recycling cavities therebetween. The one or more recycling cavities substantially fill the output area of the backlight. The backlight further includes at least one light source positioned adjacent a first edge of the backlight. The at least one light source is operable to inject light into the one or more recycling cavities through an input surface of the one or more recycling cavities, where the input surface is substantially orthogonal to the output area of the backlight. The at least one concave structure converges with the back reflector in a direction distal from the input surface.

In another aspect, the present disclosure provides a display system that includes a display panel having an illumination side and a viewing side, and an edge-lit backlight disposed on the illumination side of the display panel. The backlight has an output area. The backlight includes a back reflector facing the output area of the backlight, and a transflector that partially transmits and partially reflects incident light, the transflector being shaped to form at least one concave structure facing the back reflector to provide one or more recycling cavities therebetween. The one or more recycling cavities substantially fill the output area of the backlight. The backlight further includes at least one light source positioned adjacent a first edge of the backlight. The at least one light source is operable to inject light into the one or more recycling cavities through an input surface of the one or more recycling cavities, where the input surface is substantially orthogonal to the output area of the backlight. The at least one concave structure converges with the back reflector in a direction distal from the input surface.

In another aspect, the present disclosure provides an edge-lit backlight having an output area. The backlight includes a back reflector, and transflector means for partially transmitting and partially reflecting incident light. The transflector means includes at least one concave structure facing the back reflector to provide one or more recycling cavities therebetween, where the one or more recycling cavities substantially fill the output area of the panel. The backlight also includes light source means positioned adjacent a first edge of the backlight for injecting light into the one or more recycling cavities through an input surface of the one or more recycling cavities, where the input surface is substantially orthogonal to the output area of the backlight. The at least one concave structure converges with the back reflector in a direction distal from the input surface.

The above summary of the present disclosure is not intended to describe each disclosed embodiment or every implementation of the present disclosure. The Figures and Detailed Description that follow more particularly exemplify illustrative embodiments.

DETAILED DESCRIPTION

The present disclosure describes edge-lit backlights that include a back reflector and a transflector that partially transmits and partially reflects incident light. The transflector is shaped to form at least one concave structure facing the back reflector to provide one or more recycling cavities therebetween. At least one light source, and in some cases an array of light sources, is positioned adjacent an edge of the backlight to inject light into each recycling cavity. Advantageously, conventional packaged or unpackaged LEDs can be used as light sources.

Edge-lit backlights are well known for small displays such as those found in cellular phones, personal digital assistants, and laptop computers. Typically, such backlights use a solid lightguide to uniformly redistribute the light (from one or more light sources located at one or more edges of the display) across the area of the display panel. Solid lightguides work well for small displays; however, they do not scale well to display sizes over about 20" diagonal. Larger lightguides are heavy and difficult to design to provide uniform light output. They can also suffer from high transmission losses that limit the overall uniformity and system efficiency.

Hollow lightguides have been proposed as a way to make edge-lit backlights that weigh less and are more efficient than solid lightguides. Typically, such backlights guide the light in a hollow cavity between two films, at least one of which includes light extraction features to direct light out of the light guide. While these designs do address some of the problems of solid lightguides, they introduce new problems, such as the need to provide mechanical support for the two films to maintain the proper gap.

Edge-lit backlights that use separately colored LEDs for the light source must provide adequate color mixing as well as brightness uniformity. Several designs for edge-lit backlights that are illuminated by separate LEDs (e.g., red, green and blue LEDs) include a 'pre-mixing' zone to uniformly blend the color before the light is introduced into the area of the lightguide located behind the display. This mixing zone adds to the size and weight of the backlight and may also reduce the efficiency.

The edge-lit backlights described herein can provide uniform illumination over an output area of the backlight without requiring a pre-mixing zone. The backlight can be used for illuminating large area displays since it is very efficient and can have much lower losses than solid lightguides.

The concave nature of the transflector has been found to be particularly effective in providing uniform illumination over the area of the recycling cavity, even when using sparsely arranged discrete light sources such as LEDs. It has also been found to be effective in color mixing light from different colored discrete light sources, such as an array of individual red/green/blue LEDs.

To minimize the overall thickness of the backlight and the number of required light sources, the transflector's concave shape and its placement relative to the back reflector can provide a relatively shallow and wide recycling cavity. In some embodiments, the recycling cavity is hollow to minimize panel weight.

The transflector can include a variety of partially transmissive and partially reflective films or bodies, and for enhanced panel efficiency the transflector desirably has low absorptive losses. Structured surface films such as films having parallel grooves forming extended linear prisms, or films having patterns of pyramidal prisms such as cube corner element arrays, are one example. Reflective polarizers, whether specularly reflective or diffusely reflective, are another example. The reflective polarizer may have a coextruded polymeric multilayer construction, a cholesteric construction, a wire grid construction, or a blended (continuous/disperse phase) film construction, and thus can transmit and reflect light specularly or diffusely. A perforated specular or diffuse reflective film is another example of a suitable transflector.

Figure 1:
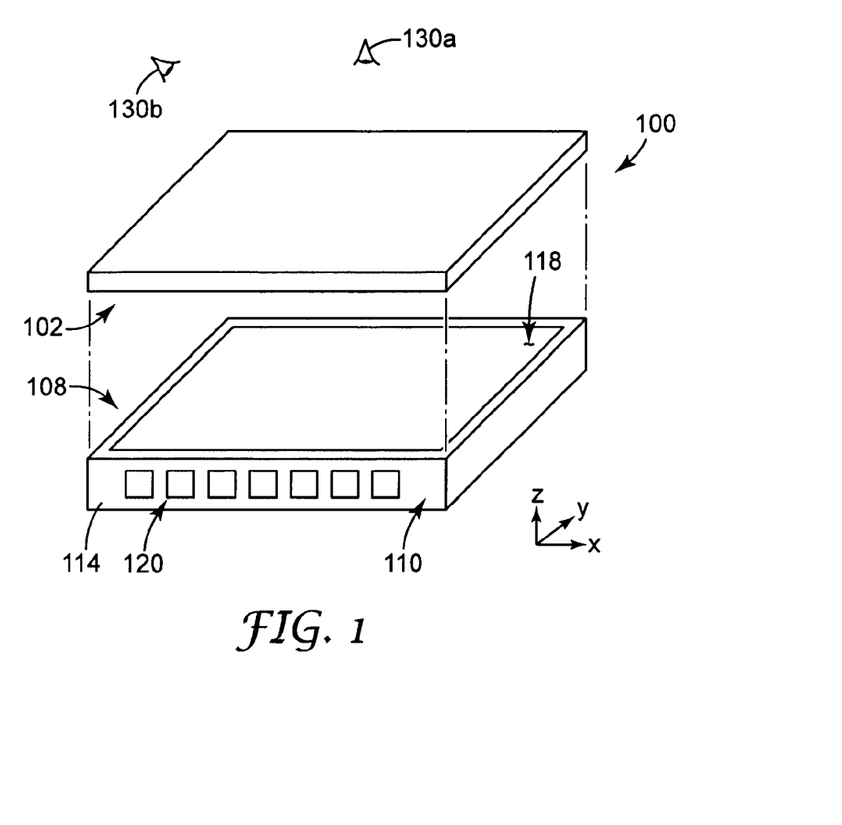
FIG. 1 is a perspective exploded view of a display system that includes an edge-lit backlight.

One embodiment of an edge-lit backlight is shown schematically in the perspective exploded view of FIG. 1. There, a display system 100 includes a display panel 102, such as a liquid crystal display (LCD) panel, and an edge-lit backlight 108 that provides large area illumination sufficient for information contained in the display panel to be easily observed. Both display panel 102 and backlight 108 are shown in simplified box-like form, but the reader will understand that each contains additional detail. Backlight 108 may also include a frame 110. Backlight 108 emits light over an extended output area 118. The output area 118, which is usually rectangular but can take on other extended area shapes as desired, may correspond to the outer surface of a film used in the backlight, or may simply correspond to an aperture in the frame 110.

Any suitable edge-lit backlight described herein (e.g., edge-lit backlight 200 of FIG. 2) may be utilized with the display system 100 illustrated in FIG. 1.

The backlight 108 also includes one or more light sources 120 positioned adjacent at least one edge 114 of the backlight 108. The light sources 120 may each emit white light, or may each emit only one of the red/yellow/green/cyan/blue (RYGCB) colors and then either be mixed to provide a white light output or be matched to provide a monochrome output.

In operation, the entire output area 118 is illuminated by light sources 120. When illuminated, the backlight 108 makes visible for a variety of observers 130*a,* 130*b* an image or graphic provided by display panel 102. In the case of an LCD panel, the image or graphic is dynamic, produced by an array of typically thousands or millions of individual picture elements (pixels), which array substantially fills the lateral dimensions, i.e., the length and width, of the display panel 102. In other embodiments the display panel 102 may include a film having a static graphic image printed thereon.

In some LCD embodiments, the backlight 108 continuously emits white light, and the pixel array of the display panel 102 is combined with a color filter matrix to form groups of multicolored pixels (such as yellow/blue (YB) pixels, red/green/blue (RGB) pixels, red/green/blue/white (RGBW) pixels, red/yellow/green/blue (RYGB) pixels, red/yellow/green/cyan/blue (RYGCB) pixels, or the like) so that the displayed image is polychromatic. Alternatively, polychromatic images can be displayed using color sequential techniques, where, instead of continuously back-illuminating the display panel 102 with white light and modulating groups of multicolored pixels in the display panel 102 to produce color, separate differently colored light sources 120 adjacent the edge 114 of backlight 108 itself (selected, for example, from red, orange, amber, yellow, green, cyan, blue (including royal blue), and white in combinations such as those mentioned above) are modulated such that the backlight 108 flashes a spatially uniform colored light output (such as, for example, red, then green, then blue) in rapid repeating succession. This color-modulated backlight is then combined with a display panel that has only one pixel array (without any color filter matrix), the pixel array being modulated synchronously with the backlight 108 to produce the whole gamut of perceived colors over the entire pixel array, provided the modulation is fast enough to yield temporal color-mixing in the visual system of the observer. In some cases, it may be desirable to provide only a monochrome display. In those cases the backlight 108 can include filters or specific sources that emit predominantly in one visible wavelength or color.

Although not shown, the display system 100 may include other optical elements, e.g., reflective polarizers, brightness enhancing layers or films, diffusers, etc. See, e.g., U.S. patent application Ser. No. 11/167,003 to Epstein et al. entitled OPTICAL ELEMENT FOR LATERAL LIGHT SPREADING IN EDGE-LIT DISPLAYS AND SYSTEMS USING SAME.

Figure 2:
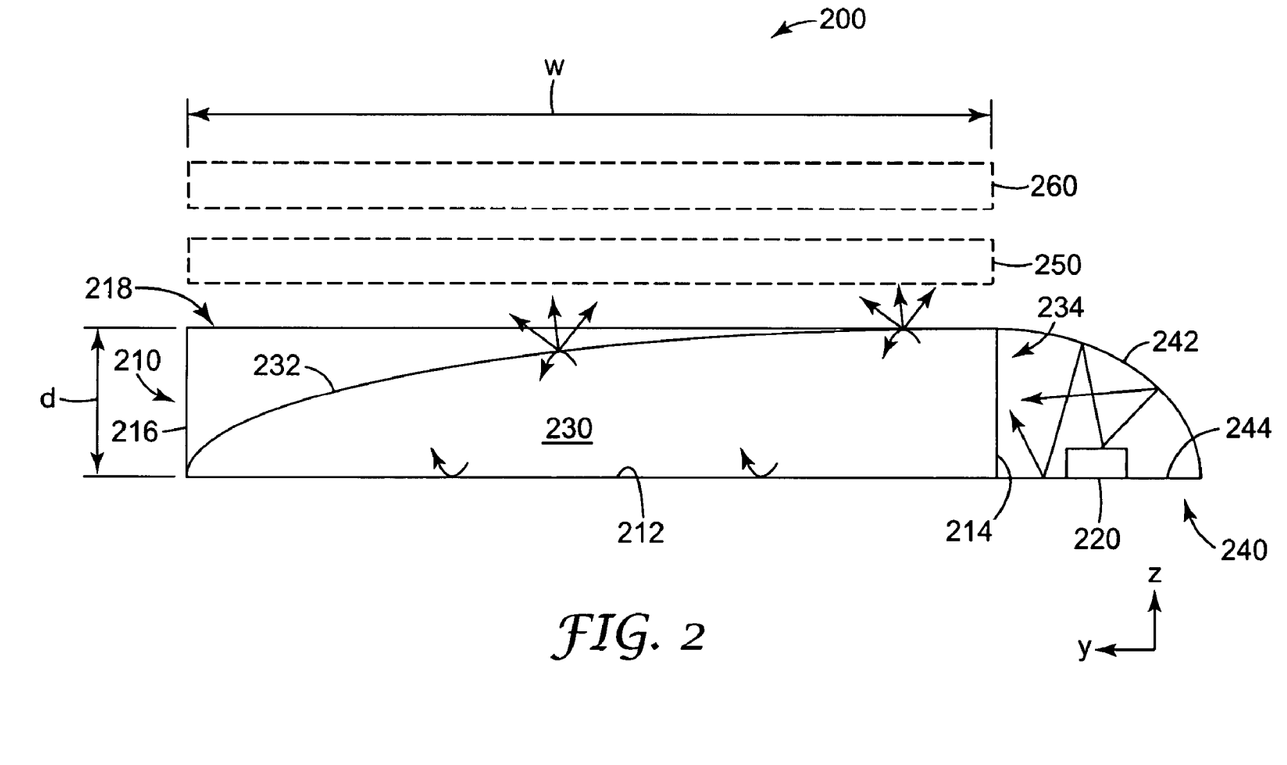
FIG. 2 is a schematic cross-section view of one embodiment of an edge-lit backlight that includes at least one light recycling cavity.

FIG. 2 is a schematic cross-section view of one embodiment of an edge-lit backlight 200. As illustrated, the backlight 200 includes a frame 210 having an output area 218 and a back reflector 212 facing the output area 218. The frame 210 includes a first edge 214 and a second edge 216 opposite the first edge 214. The backlight 200 further includes a transflector 232 that partially transmits and partially reflects incident light. The transflector 232 is shaped to form a concave structure facing the back reflector 212. This concave structure provides a recycling cavity 230 between the transflector 232 and the back reflector 212.

The backlight 200 also includes at least one light source 220 that is positioned adjacent a first edge 214 of the backlight 200. In the embodiment illustrated in FIG. 2, the light source 220 is located in an edge reflecting cavity 240 that includes a side reflector 242. In some embodiments, the edge reflecting cavity 240 can also include a back reflector 244. This back reflector 244 can either be contiguous with the back reflector 212 of the backlight 200, or can be a separate reflector.

The side reflector 242 may include any suitable shape and may be curved (as illustrated) or flat. If the side reflector 242 is curved, such curve may include any suitable type of curve, e.g., elliptical or parabolic. In the illustrated embodiment, the side reflector 242 is curved in one dimension.

The side reflector 242 may be any suitable type of reflector, e.g., a metalized reflector, a multilayer dielectric reflector, or a multilayer layer polymer film (MOF) reflector. The space within the edge reflecting cavity 240 may be filled or may be empty. In embodiments where the space is filled, e.g., with a transparent optical body, then the side reflector 242 may be a reflective coating on the body. In embodiments where the space is empty, the reflector 242 may be a front surface reflector. Different configurations of reflective cavities are described further in U.S. patent application Ser. Nos. 10/701,201 and 10/949,892.

As illustrated in FIG. 2, the light source 220 is positioned adjacent the first edge 214 of the backlight 200. The light source 220 is operable to inject light into the recycling cavity 230 through an input surface 234 of the cavity 230. The input surface 234 is an area (if the cavity is hollow), or surface (if the cavity is solid) that is substantially orthogonal to the output area 218 of the backlight 200. Also, as shown, the concave structure formed by the transflector 232 and the back reflector 212 converges with the back reflector 212 in a direction distal from the input surface 234. In other words, a distance L between the transflector 232 and the back reflector 212 decreases in a direction from the input surface 234 to edge 216 of the frame 210 along the y-axis for at least a portion of the transflector 232.

Then backlight 200 can include an optional diffuser layer 250 positioned adjacent the output area 218 such that it receives light from the output area 218. The diffuser layer 250 may be any suitable diffuser film or plate. For example, the diffuser layer 250 can include any suitable diffusing material or materials. In some embodiments, the diffuser layer 250 may include a polymeric matrix of polymethyl methacrylate (PMMA) with a variety of dispersed phases that include glass, polystyrene beads, and $CaCO_3$ particles. Exemplary diffusers can include 3M™ Scotchcal™ Diffuser Film, types 3635-30 and 3635-70, available from 3M Company, St. Paul, Minn.

The backlight 200 optionally includes an arrangement 260 of light management films, which may also be referred to as a light management unit, which is positioned such that the optional diffuser layer 250 is between the light management films 260 and the output area 218. The light management films 260 affect the illumination light propagating from the backlight output area 218. The light management films 260 may include any suitable films or layers, e.g., diffusers, reflective polarizers, brightness enhancing films, etc.

Collectively, the recycling cavity 230 substantially fills the output area 218. Thus, if the output area 218 is depicted in plan view, as, for example, when viewed by a distant observer situated along an axis perpendicular to the output area, the summed projected area of the concave recycling cavity (even though such cavity may not be visually apparent to the distant observer) is more than half the surface area of the output area 218, preferably at least 75%, 80%, or 90% of the output area 218, more preferably about 100% of the output area 218. Whether the backlight 200 has only one concave recycling cavity or a plurality of them, the projected area of the cavity or cavities when viewing the output area in plan view accounts for preferably at least 75%, 80%, 90%, or 100%, of the backlight output area 218.

FIG. 2 illustrates how light emitted by the light sources 220 is partially transmitted and partially reflected by the transflector 232, and how this in combination with the back reflector 212 provides light recycling within the cavity 230, as well as light emission or leakage spread over the lateral dimensions of the cavity 230. The concave structure of the transflector 232 not only helps define the boundaries of the recycling cavity 230, it also has a tendency to confine recycled light within those boundaries, and to spread out the angular wedge of emitted light due to the changing geometry of the transflecting surface. Light confinement within a particular recycling cavity is a function of design details.

As discussed in further detail herein, a given light source can be (1) an active component such as an LED die or fluorescent lamp that converts electricity to light or a phosphor that converts excitation light to emitted light, or (2) a passive component such as a lens, waveguide (such as a fiber), or other optical element that transports and/or shapes the light emitted by an active component, or (3) a combination of one or more active and passive components. For example, light sources 220 in FIG. 2 may be packaged side-emitting LEDs in which an LED die is disposed behind the back reflector 244 proximate a circuit board or heat sink, but a shaped encapsulant or lens portion of the packaged LED is disposed in the reflecting cavity 240 by extending through a slot or aperture in the back reflector 244. More discussion of light sources is provided herein.

In the embodiment of FIG. 2, the recycling cavity 220 is substantially one-dimensional, extending across the output area 218 in a strip that runs parallel to the x-axis. The transflector 232 is shaped to form the depicted concave structure in the y-z sectional plane, but in an orthogonal x-z sectional plane the transflector 232 is substantially straight and flat. Stated differently, the transflector exhibits simple curvature. In other embodiments, the transflector 232 can exhibit compound curvature, wherein it is shaped to form concave structures in both the y-z and x-z sectional planes.

Back reflector 212 is preferably highly reflective for enhanced efficiency. For example, the back reflector 212 may have an average reflectivity for visible light emitted by the light source 220 of at least 90%, 95%, 98%, or 99% or more. The back reflector 212 can be a predominantly specular, diffuse, or combination specular/diffuse reflector, whether spatially uniform or patterned. In some cases the back reflector 212 can be made from a stiff metal substrate with a high reflectivity coating or a high reflectivity film laminated to a supporting substrate. Suitable high reflectivity materials include, without limitation, Vikuiti™ Enhanced Specular Reflector (ESR) multilayer polymeric film available from 3M Company; a film made by laminating a barium sulfate-loaded polyethylene terephthalate film (2 mils thick) to Vikuiti™ ESR film using a 0.4 mil thick isooctylacrylate acrylic acid pressure sensitive adhesive, the resulting laminate film referred to herein as "EDR II" film; E-60 series Lumirror™ polyester film available from Toray Industries, Inc.; porous polytetrafluoroethylene (PTFE) films, such as those available from W. L. Gore & Associates, Inc.; Spectralon™ reflectance material available from Labsphere, Inc.; Miro™ anodized aluminum films (including Miro™ 2 film) available from Alanod Aluminum-Veredlung GmbH & Co.; MCPET high reflectivity foamed sheeting from Furukawa Electric Co., Ltd.; and White Refstar™ films and MT films available from Mitsui Chemicals, Inc.

The back reflector 212 may be substantially flat and smooth, or it may have a structured surface associated with it to enhance light scattering or mixing. Such a structured surface can be imparted (a) on the reflective surface of the back reflector, or (b) on a transparent coating applied to the reflective surface. In the former case, a highly reflective film may be laminated to a substrate in which a structured surface was previously formed, or a highly reflective film may be laminated to a flat substrate (such as a thin metal sheet, as with Vikuiti™ Durable Enhanced Specular Reflector-Metal (DESR-M) reflector available from 3M Company) followed by forming the structured surface such as with a stamping operation. In the latter case, a transparent film having a structured surface can be laminated to a flat reflective surface, or a transparent film can be applied to the reflector 212 and then afterwards a structured surface imparted to the top of the transparent film.

The edges of frame 210 (other than first edge 214 that includes the input surface 234) are located along the outer boundary of the output area 218 are preferably lined or otherwise provided with high reflectivity vertical walls to reduce light loss and improve recycling efficiency. The same reflective material used for the back reflector 212 can be used to form these walls, or a different reflective material can be used. In exemplary embodiments, the side walls are diffusely reflective.

The transflector 232 is or includes a structure such as a film that partially transmits and partially reflects incident light, where the partial transmission is high enough to permit efficient extraction of light through the transflector 232, but the partial reflection is also high enough to support light recycling when combined with a back reflector. A variety of different films can be used, as discussed herein, with the optimal geometry and characteristics in general being different for each, and being a function of the light sources used and the back reflector 212, so as to achieve optimal luminance, luminance uniformity (source hiding), and color mixing. (In some cases the backlight designer may be presented with a particular recycling cavity design, such as a cavity module discussed herein, and may then select suitable sources for use with the given cavity.)

Some suitable films will now be explained further, but the discussion is not intended to be limiting, and any of the described films can be used singly or in combination with others to produce the desired transmission and reflection properties. For combinations of films, the films may or may not be attached to each other. If they are attached, any known attachment mechanisms may be used, and they may be attached over their entire major surfaces or only at discrete points or lines. If adhesives are used, the adhesive can be transparent, diffusive, and/or birefringent.

Some of the films suitable for use as a transflector fall into categories referred to herein as semi-reflective films and light deflecting films.

Generally, semi-reflective films refer to films and the like that reflect on the order of 30 to 90% of normally incident visible light, and have low enough absorption that they transmit a substantial portion, preferably substantially all, of the remaining (non-reflected) light. Reflection and transmission can be specular, diffuse, or a combination thereof, whether spatially uniform or patterned. Diffuse reflection can be produced using surface diffusers (including holographic diffusers), bulk diffusers, or both. The appropriate level of reflectivity can depend on a variety of factors including the number of light sources and their placement adjacent the edge of the backlight, the intensity and the emission profile (angular distribution of intensity) of the source(s), the depth of the recycling cavity, the desired degree of brightness and color uniformity in the output of the backlight, and the presence or absence of other components such as a diffuser plate or a light management unit in the backlight. Higher reflectivity films used for the transflector tend to enhance brightness uniformity and color uniformity of the backlight at the expense of efficiency. The decrease in efficiency occurs because the average number of reflections within the recycling cavity increases, and each reflection is associated with at least some loss. As mentioned previously, it is desirable to minimize visible light absorption not only of the transflector, but also of the back reflector and any reflective side walls.

One example of a semi-reflective film suitable as a transflector is a thin metalized mirror, where the metal coating is thin enough to transmit some visible light. The thin metal coating can be applied to a film or to a plate substrate.

Another example of a semi-reflective film is referred to in the art as a controlled transmission mirror film (CTMF). Such a film is made by applying diffusely reflective coatings or layers to both sides of a multilayer interference mirror stack, such as the ESR mirror film mentioned herein. Another example of a semi-reflective film is a multilayer polymer mirror film that has been flame embossed to disrupt the multilayer interference stack in some places by brief exposure to a flame.

Reflective polarizers are still other examples of a semi-reflective films. Such polarizers, which include cholesteric polarizers, multilayer polymeric polarizers made by coextrusion and stretching techniques, wire grid polarizers, and diffuse blend polarizers having a continuous/disperse phase construction, transmit nominally half of the light from an unpolarized source (corresponding to a first polarization state) and reflect nominally the other half (corresponding to an orthogonal second polarization state). Examples include any of the dual brightness enhancement film (DBEF) products and any of the diffusely reflective polarizing film (DRPF) products available from 3M Company under the Vikuiti brand. See also, for example, the reflective films disclosed in U.S. Pat. No. 5,882,774 (Jonza et al.) and U.S. Pat. No. 6,111,696 (Allen et al.), and in U.S. Patent Publication 2002/0190406 (Merrill et al.). If one reflective polarizing film is inadequate, two or more such films can be combined and then shaped to form the concave structure(s).

Non-polarizing diffuse reflectors are still more examples of semi-reflective films. Such reflectors can be made by dispersing specularly reflective particles or flakes in a low absorption, transparent polymer matrix, forming a film or other body. The reflective particles or flakes can be distributed through the thickness of a thick film, or can be disposed on a surface of a substrate as a thin curable coating. Numerous other diffuse reflector constructions and methods of making are also known. Diffuse coatings can be applied to reflectors or other bodies by ink-jet printing, screen printing, and other known techniques. Diffuse adhesives can also be used, where the diffusion is produced by refractive index mismatched particles, or air voids. Diffuse reflectors used for the transflector preferably have low absorption and average transmission values over visible wavelengths from 20% to 80%.

Semi-reflective films also include reflective films that have been provided with a pattern of fine holes or apertures to increase transmission and reduce reflection. This can be done by simply perforating a reflective film in a desired pattern. Virtually any of the reflective films discussed herein can be used as a starting material, and then converted or processed to provide the perforations or other apertures. U.S. Patent Application Publications US 2004/0070100 (Strobel et al.) and US 2005/0073070 (Getschel et al.) teach suitable techniques for flame-perforating films. The pattern of holes or apertures can be uniform or non-uniform, and in the latter case both the position and the hole size can be random or pseudo-random. In one example, a sheet of Vikuiti™ ESR film is perforated with uniformly spaced round holes, the holes positioned in a hexagonal array with a hole-to-hole spacing equal to a multiple of the hole diameter.

Generally, light deflecting films suitable as a transflector in the disclosed backlights refer to films and the like having minute structures arranged to form a structured surface or the like that reflects and transmits light as a function of the direction of incidence of the light. One or both sides of the film can have such a structured surface. Useful structures include linear prisms, pyramidal prisms, cones, and ellipsoids, which structures may be in the form of projections extending out from a surface or pits extending into the surface. The size, shape, geometry, orientation, and spacing of the structures can all be selected to optimize the performance of the transflector, recycling cavity, and backlight, and the individual structures can be symmetric or asymmetric. The structured surface can be uniform or non-uniform, and in the latter case both the position and size of the structures can be random or pseudo-random. Disrupting regular features by periodic or pseudo-random variation of size, shape, geometry, orientation, and/or spacing may be used to adjust the color and brightness uniformity of the backlight. In some cases it may be beneficial to have a distribution of small and large structures.

Examples of suitable light deflecting films include commercial one-dimensional (linear) prismatic polymeric films such as Vikuiti™ brightness enhancement films (BEF), Vikuiti™ transmissive right angle films (TRAF), Vikuiti™ image directing films (IDF), and Vikuiti™ optical lighting films (OLF), all available from 3M Company, as well as conventional lenticular linear lens arrays. In the case of these one-dimensional prismatic films, the prismatic structured surface preferably faces downward toward the back reflector.

Further examples of light deflecting films, where the structured surface has a two-dimensional character, include cube corner surface configurations such as those disclosed in U.S. Pat. No. 4,588,258 (Hoopman), U.S. Pat. No. 4,775,219 (Appeldorn et al.), U.S. Pat. No. 5,138,488 (Szczech), U.S. Pat. No. 5,122,902 (Benson), U.S. Pat. No. 5,450,285 (Smith et al.), and U.S. Pat. No. 5,840,405 (Shusta et al.); unsealed cube corner sheeting such as 3M™ Scotchlite™ Reflective Material 6260 High Gloss Film and 3M™ Scotchlite Reflective Material 6560 High Gloss Sparkle Film, available from 3M Company; inverted prism surface configurations such as described in U.S. Pat. No. 6,287,670 (Benson et al.) and U.S. Pat. No. 6,280,822 (Smith et al.); structured surface films disclosed in U.S. Pat. No. 6,752,505 (Parker et al.) and patent publication US 2005/0024754 (Epstein et al.); and beaded retroreflective sheeting.

The light deflecting films can be used alone or in combination with other suitable transflectors. If used in combination with a different type of transflector, the light deflecting film can be positioned to be on the interior of the recycling cavity (closest to the back reflector), and the other film, which may be a semi-reflecting film (for example, a diffusing film) or another light deflecting film, can be positioned on the exterior of the recycling cavity. If two or more linear prismatic light deflecting films are combined, they can be aligned, misaligned, or "crossed" such that the prism direction of one film is perpendicular to the prism direction of the other film.

Returning now to FIG. 2, the one or more light sources 220 are shown schematically. In most cases, these sources are compact light emitting diodes (LEDs). In this regard, "LED" refers to a diode that emits light, whether visible, ultraviolet, or infrared. It includes incoherent encased or encapsulated semiconductor devices marketed as "LEDs", whether of the conventional or super radiant variety. If the LED emits non-visible light such as ultraviolet light, and in some cases where it emits visible light, it is packaged to include a phosphor (or it may illuminate a remotely disposed phosphor) to convert short wavelength light to longer wavelength visible light, in some cases yielding a device that emits white light. An "LED die" is an LED in its most basic form, i.e., in the form of an individual component or chip made by semiconductor processing procedures. The component or chip can include electrical contacts suitable for application of power to energize the device. The individual layers and other functional elements of the component or chip are typically formed on the wafer scale, and the finished wafer can then be diced into individual piece parts to yield a multiplicity of LED dies. More discussion of packaged LEDs, including forward-emitting and side-emitting LEDs, is provided herein.

If desired, other visible light emitters such as linear cold cathode fluorescent lamps (CCFLs) or hot cathode fluorescent lamps (HCFLs) can be used instead of or in addition to discrete LED sources as illumination sources for the disclosed backlights. For example, in some applications it may be desirable to replace the light sources 220 with a different light source such as a long cylindrical CCFL, or with a linear surface emitting light guide emitting light along its length and coupled to a remote active component (such as an LED die or halogen bulb). Examples of such linear surface emitting light guides are disclosed in U.S. Pat. No. 5,845,038 (Lundin et al.) and U.S. Pat. No. 6,367,941 (Lea et al.). Fiber-coupled laser diode and other semiconductor emitters are also known, and in those cases the output end of the fiber optic waveguide can be considered to be a light source with respect to its placement in the disclosed edge reflecting cavities or otherwise adjacent the input surface of the reflecting cavities. The same is also true of other passive optical components having small emitting areas such as lenses, deflectors, narrow light guides, and the like that give off light received from an active component such as a bulb or LED die. One example of such a passive component is a molded encapsulant or lens of a side-emitting packaged LED.

Returning to FIG. 2, the recycling cavity 230 has a depth d as shown and a length L and width W substantially equal to the length and width of the output area 218. In some embodiments, the width W of the recycling cavity is at least 2.5 times the depth d; in other embodiments, W is at least 5 times d.

Figure 3:
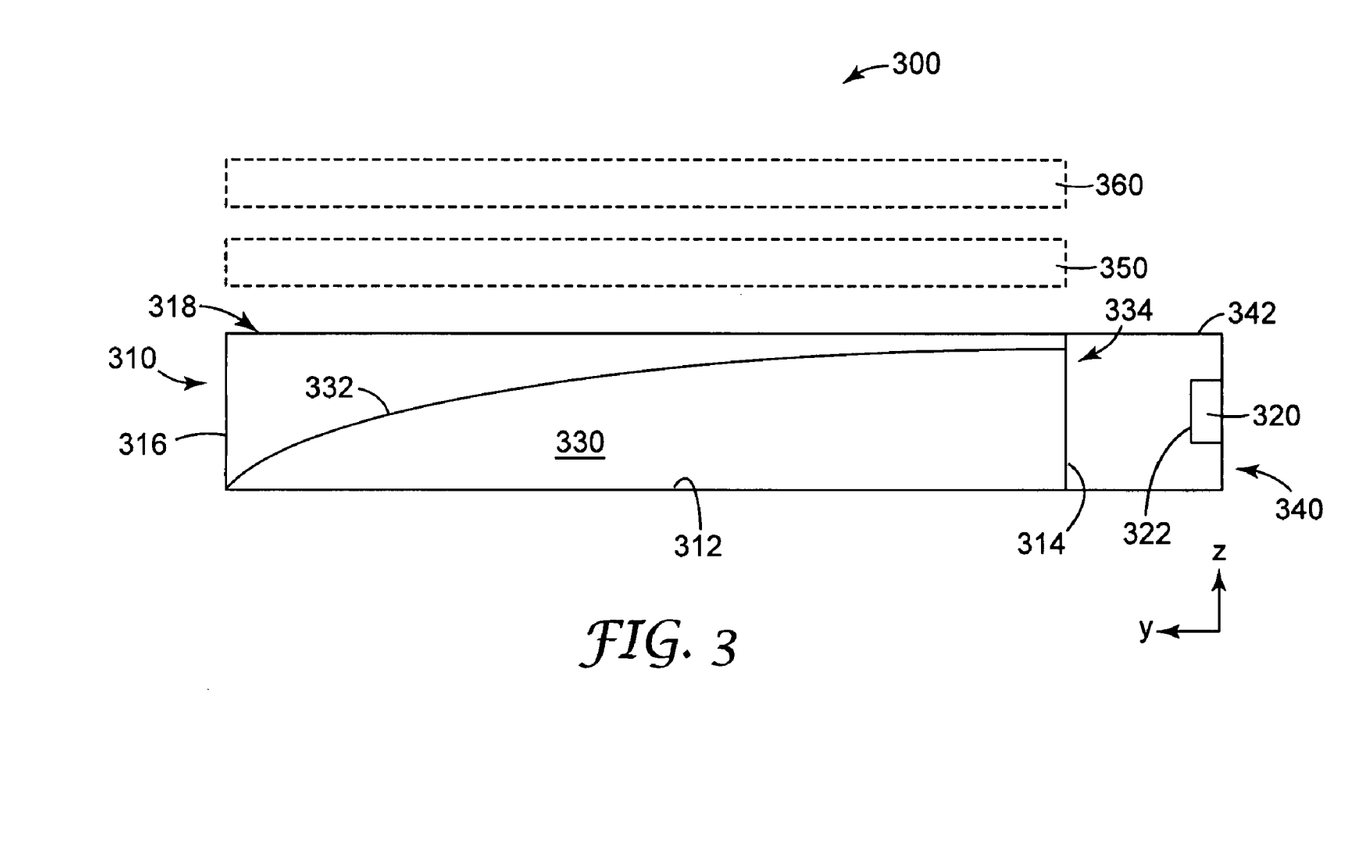
FIG. 3 is a schematic cross-section view of another embodiment of an edge-lit backlight that includes at least one light recycling cavity.

As previously mentioned herein, any suitable type of edge reflecting cavity can be used with the backlights of the present disclosure. For example, FIG. 3 is a schematic cross-section view of another embodiment of a backlight 300. The backlight 300 includes a frame 310 having an output area 318, a back reflector 312 facing the output area 318, a recycling cavity 330 formed by a transflector 332 and the back reflector 312, and one or more light sources 320 positioned adjacent a first edge 314 opposite second edge 316 of the backlight 300. All of the design considerations and possibilities in regard to the back reflector 212, the recycling cavity 230, the transflector 232, and the light sources 220 of the embodiment illustrated in FIG. 2 apply equally to the back reflector 312, the recycling cavity 330, the transflector 332, and the light sources 320 of the embodiment illustrated in FIG. 3. The backlight 300 can also include optional diffuser layer 350 and light management films 360. Any suitable diffuser layer 350 can be used with backlight 300, e.g., those diffuser layers described in regard to diffuser layer 250 of FIG. 2. Further, any suitable layers or films can be used with optional light management films 360, e.g., those layers or films described in regard to light management films 260 of FIG. 2.

The one or more light sources 320 are positioned within edge reflecting cavity 340 such that the light sources 320 inject light into the recycling cavity 330 through an input surface 334 of cavity 330. The edge reflecting cavity 340 is configured such that an emitting surface 322 of each light source 320 faces the input surface 334 of the cavity 330. The edge reflecting cavity 340 can include sidewalls 342 that are preferably reflective. Such reflective side walls 342 can direct light emitted by the light sources 320 in a direction toward the input surface 334. The same reflective material or materials used for the side reflector 242 of the edge reflecting cavity 240 illustrated in FIG. 2 can be used for the reflective side walls 342 of the reflecting cavity 340 of FIG. 3. Although shown as taking a rectangular shape, the edge reflecting cavity 340 can take any suitable shape such that it directs light emitted by the light sources 320 into the recycling cavity 330 through the input surface 334.

Figure 4:
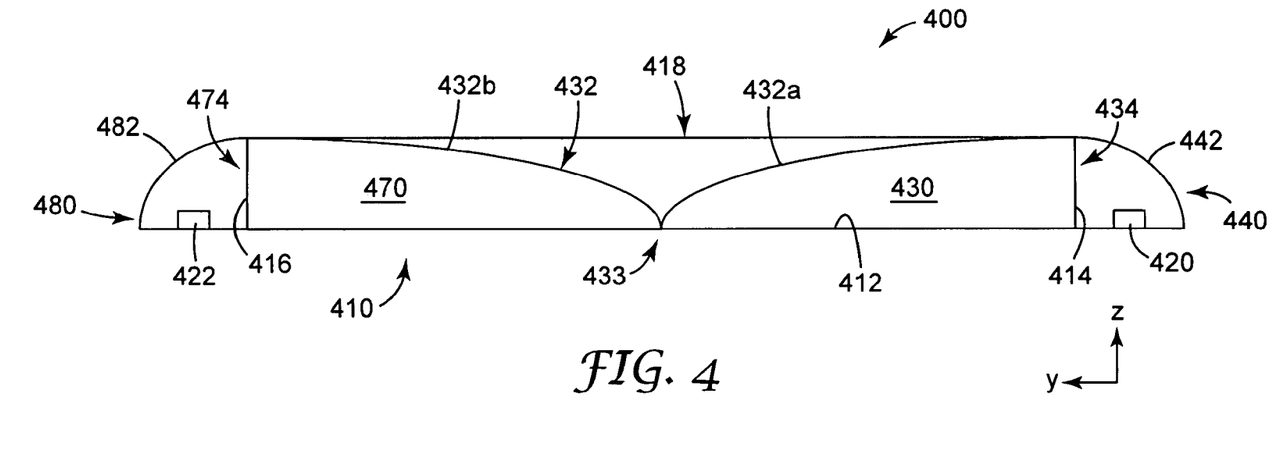
FIG. 4 is a schematic cross-section view of an embodiment of an edge-lit backlight that includes at least two light recycling cavities.
Figure 5:
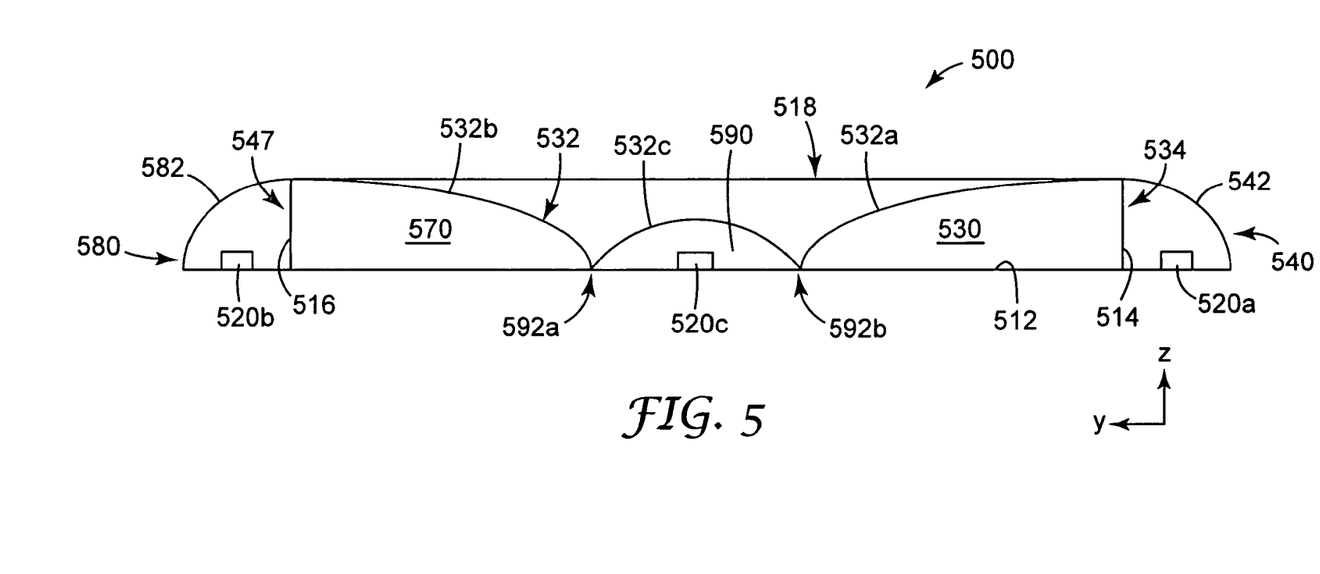
FIG. 5 is a schematic cross-section view of an embodiment of a combination edge-lit and direct-lit backlight that includes at least three light recycling cavities.

Turning now to FIGS. 4-5, we see there a small sample of the wide variety of different geometrical configurations with which one can construct suitable edge-lit backlights. The figures are all represented as cross-section views directed along the x-axis, which is perpendicular to the plane of the figures. However, the figures can also be interpreted to represent cross-section views directed along the orthogonal y-axis, thus generally depicting both embodiments in which the transflector has simple curvature in the y-z plane, as well as those in which the transflector has compound curvature in both the y-z and x-z planes. In this regard, "curvature" should be understood broadly, and is not limited to circular geometric arcs or even to curved shapes.

FIG. 4 shows a direct-lit backlight 400 having two recycling cavities 430, 470 formed by two concave structures in a transflector 432, in combination with the back reflector 412. The transflector 432 is shown in two parts, 432a and 432b, corresponding to the two concave structures. These parts may or may not be connected by a portion of the transflector 432 in the intermediate region 433. The cavities 430, 470 are sized to substantially fill the output area 418, preferably accounting for 75%, 80%, or 90% or more of the plan view area of the output area 418. Regions disposed behind the output area 418 that lack concave recycling cavities collectively amount to a small percentage (less than 25%, 20%, or 10%, and preferably about 0%) of the plan view area of the output area 418. These regions may have little or no detrimental effect on the brightness uniformity across the output area 418 because of the proximity of the recycling cavit(ies), the angular distribution of light emitted by the recycling cavit(ies), and the position of the output area above the recycling cavit(ies) (e.g., the placement of an optional diffuser plate (not shown)). To the extent the regions are present, in exemplary embodiments they are distributed preferentially near or along the periphery of the output area 418 and away from the central portion of the output area 418.

The backlight 400 also includes one or more light sources 420 positioned adjacent a first edge 414 of frame 410 inside edge reflecting cavity 440 having side reflector 442. Any suitable light source and edge reflecting cavity described herein can be used with the backlight 400. The light sources 420 are operable to inject light into the recycling cavity 430 through input surface 434 of the cavity 430.

The backlight 400 also includes one or more light sources 422 positioned adjacent a second edge 416 of frame 410 within edge reflecting cavity 480 having edge reflector 482. Any suitable light source and edge reflecting cavity can be positioned adjacent second edge 416. The light source 422 is operable to inject light into the cavity 470 through input surface 474.

The backlight 400 can also include other layers or films positioned to receive light from output area 418, e.g., diffuser layer 350 and/or light management unit 360 of FIG. 3.

FIG. 5 shows a combination edge-lit and direct-lit backlight 500 having three recycling cavities 530, 570, and 590 formed by three concave structures in a transflector 532, in combination with the back reflector 512. The transflector 532 is shown in three parts, 532a, 532b, 532c, corresponding to the three concave structures. These parts may or may not be connected by portions of the transflector 532 in the intermediate regions 592a, 592b, the area of which is preferably minimized. Light sources 520a, 520b, 520c are positioned to inject light into their respective cavities 530, 570, 590. The illustrated light sources 520a-c may each represent a single light source or a row of light sources extending parallel to the x-axis. The recycling cavities 530, 570 can take the same shape; alternatively, each cavity can take a different shape.

Any suitable direct-lit recycling cavity can be used with the backlight 500, e.g., the direct-lit recycling cavities described in U.S. patent application Ser. No. 11/212,166 entitled DIRECT-LIT BACKLIGHT HAVING LIGHT RECYCLING CAVITY WITH CONCAVE TRANSFLECTOR.

Figure 6:
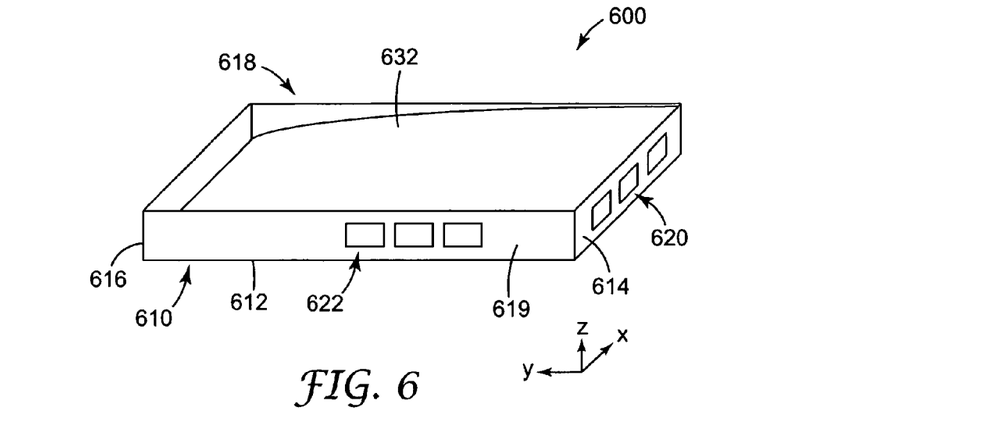
FIG. 6 is a perspective view of an embodiment of an edge-lit backlight that includes one light recycling cavity having light sources disposed on adjacent edges of the backlight.

In some embodiments of the present disclosure, one or more light sources can be positioned adjacent two or more edges of the frame of the backlight. For example, FIG. 6 is a schematic perspective view of a backlight 600. The backlight 600 includes a frame 610 and a back reflector 612. The backlight 600 also includes an output area 618 facing the back reflector 612. Light sources 620 are positioned adjacent a first edge 614 of the backlight 600, and light sources 622 are positioned adjacent a second edge 619 of the backlight 600. The light sources 620, 622 are operable to inject light into an input surface of a recycling cavity (not shown) formed by a transflector 632 that is shaped to form a concave structure facing the back reflector 612. All of the design considerations and possibilities for the frame 210, the back reflector 212, the light sources 220, and the transflector 232 of the embodiment illustrated in FIG. 2 apply equally to the frame 610, the back reflector 612, the light sources 620 and 622, and the transflector 632 of the embodiment illustrated in FIG. 6.

In the embodiment illustrated in FIG. 6, the light sources 620 are positioned adjacent edge 614 such that the light sources 620 are operable to inject light into the input surface of the recycling cavity formed by the transflector 632 and the back reflector 612. The concave structure formed by the transflector 632 converges with the back reflector 612 in a direction distal from the input surface of the recycling cavity. In other words, the transflector 632 converges with the back reflector 612 in a direction from the first edge 614 where the light sources 620 are positioned to a third edge 616 of the backlight 600.

In general, the light sources 620 are operable to inject light into the input surface of the recycling cavity in a direction parallel with the y-axis. In other words, the light from light sources 620 is injected in a direction that is substantially normal to at least a portion of the transflector 632.

In contrast to light sources 620, light sources 622, positioned adjacent second edge 619, are operable to inject light into the recycling cavity in a direction along the x-axis, which, in this embodiment, is the direction that the transflector extends along. In other words, little if any light injected by light sources 622 will be orthogonal to the surface of the transflector.

Figure 7:
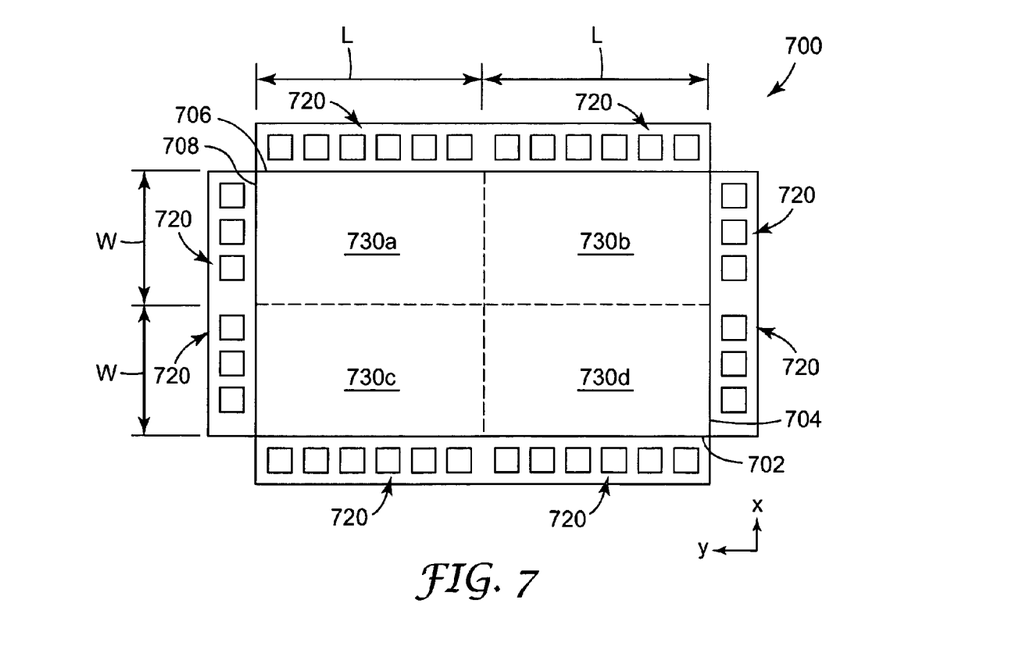
FIG. 7 is a schematic plan view of an embodiment of an edge-lit backlight that includes four recycling cavities and light sources positioned adjacent four edges of the backlight.

FIG. 7 is a plan view of an edge-lit backlight showing the placement of multiple light recycling cavities behind the output area of the panels. The output area of the backlight has a 16:9 aspect ratio, which is currently popular in LCD TVs. In FIG. 7, a backlight output area (not shown) is substantially filled by an array of four recycling cavities 730*a-d*. Each recycling cavity is formed by a transflector shaped to form a concave structure facing a back reflector. The transflector is shaped to define one concave structure in the x-z plane and another concave structure in the orthogonal y-z plane, the former defining a width W and the latter defining a length L of each recycling cavity. Light sources 720 are positioned adjacent four edges 702, 704, 706, 708 of the backlight 700.

FIG. 7 can also be construed to show embodiments in which the transflector has simple curvature to define one or more linear tunnel-like structures, but where vertical partitions are disposed between the transflector and the back reflector to segment a recycling cavity into separate zones or sub-cavities. For example, the transflector may form a single concave structure in the x-z plane between the top and bottom edges of output area 718, forming a recycling cavity of width 2W and length 2L (where W and L are as depicted in FIG. 7), except that a single vertical partition, preferably made of a highly reflective material, whether specular or diffuse, is arranged between the transflector and the back reflector as shown by the broken line in the x-direction to define two distinct zones or cavities 730*a*/730*c* and 730*b*/730*d*. As another example, the transflector may form two adjacent concave structures in the x-z plane to form two recycling cavities, each having a width W and a length 2L (where W and L are as depicted in FIG. 7), except that a vertical partition is disposed in each concave structure along the x-direction between the transflector and the back reflector to segment the first cavity into two cavities 730*a*/730*b*, and to segment the second cavity into two cavities 730*c*/730*d*.

Further, for example, the transflector can be shaped such that it is at a maximum depth at all four corners of the backlight 700 and at a minimum depth along each of the dashed lines in FIG. 7. This construction would form complex concave structures having curvature in the x-z plane and the y-z plane. Such structures would have a band-shell-like shape where the transflector converges with the back reflector in two orthogonal directions distal from two adjacent edges of the backlight 700. For example, recycling cavity 730*d* would be formed by a transflector and back reflector converging in the positive x-direction away from edge 702, and also in the positive y-direction away from edge 704.

In general, the recycling cavities can take any suitable plan view shape, whether they are simply curved or complex curved. Polygons (e.g., triangles, rectangles, trapezoids, pentagons, hexagons, etc.), circles, ellipses, and any other desired shapes are contemplated. The geometry can be tailored to achieve high efficiency and brightness and color uniformity in the backlight.

The recycling cavities formed by the concave transflector and back reflector are desirably relatively shallow in the z-direction (i.e., small depth d) and relatively wide in a transverse direction. Depth d of a particular cavity refers to the maximum separation in that cavity between the back reflector and the transflector along an axis perpendicular to the output area, i.e., along the z-direction. Width (W) of a cavity refers to a lateral dimension of the cavity measured as follows: beginning with the shape of the cavity in plan view (e.g., FIG. 7), the width of the cavity is the minor dimension of the smallest rectangle that can circumscribe the plan view cavity shape. In some embodiments, the disclosed recycling cavities can have widths W greater than 2d, preferably at least 2.5d or 5d or more. Length (L) of a cavity refers to the major dimension of the smallest rectangle that can circumscribe the plan view cavity shape. In special cases the smallest rectangle may be a square, in which case L=W.

Backlights utilizing more than one of the disclosed recycling cavities, and particularly those having zones or arrays of distinct cavities, each of which is illuminated by its own light source(s) which are separately controlled or addressable relative to light source(s) in neighboring cavities, can be used with suitable drive electronics to support dynamic contrast display techniques and color sequential display techniques, in which the brightness and/or color distribution across the output area of the backlight is intentionally non-uniform. Thus, different zones of the output area can be controlled to be brighter or darker than other zones, or the zones can emit in different colors, simply by appropriate control of the different light sources in the different recycling cavities.

The disclosed concave recycling cavities can be fabricated for backlights using a wide variety of assembly methods and techniques.

In one method, a single piece of transflective film spans the entire width of a backlight enclosure, where the edges of the film are wedged between or are physically affixed to sidewalls of the enclosure to form a concave tunnel-like structure. This method is particularly suited to relatively small displays.

In the case of thin and wide backlight units, it can be advantageous to use multiple concave tunnel-like structures. Scoring a transflective film, i.e., cutting through a portion of the film's thickness along one or more lines, has been found to be a convenient technique for defining the boundaries of the concave structures. Another useful technique is creasing the transflective film by folding it along one or more lines. Scoring and creasing can facilitate the assembly of multiple concave structures from a single film by providing defined positions at which the film is predisposed to fold. Scoring can be accomplished by any known scoring technique, including laser methods, thermal methods such as hot wire or hot knife, and known kiss-cutting techniques.

When using multiple tunnel-like structures formed from a single film, physical attachment of the film to the backplane, sidewalls, or both the backplane and sidewalls of the backlight enclosure can provide the film with a stable and robust structure. Examples of methods for physical attachment of a concave film to a backlight include, but are not limited to, pinning scored sections of the film to the backplane via rivets, screws, staples, thermal or ultrasonic spot welds, plastic pins that snap into the backplane (which may also be used to support the diffuser plate), pins that snap into the sidewalls of the backlight and pin the scored areas of the film to the backplane, adhesive strips on the backplane, and the like.

Edges of the concave film can be attached to positions or slots molded into the sidewall reflectors of the backlight enclosure that help define the shape of the concave structure. Alternatively, the film can be prepared to be rigid enough so that the concave structure can snap into predefined slots in the sidewalls or reflective backplane. The stiffness or rigidity of a transflector can be enhanced, in general, by corrugating at least a portion of the transflector. A transflector that lacks sufficient stiffness by itself can also be combined with (e.g., placed atop) a transparent support having a suitable surface shape.

Another approach to secure a scored film into a backlight enclosure involves the use of supporting members, which can be molded into the sidewall structure of the enclosure or snap into the sidewalls of the enclosure. This method can utilize transparent polymer rods that snap into predefined positions in the sidewalls of the enclosure, spanning a length or width dimension of the backlight, thus providing guides through which a transflector can be woven or threaded, with the film being secured at its edges using techniques described above. Alternatively, the rods can be replaced with fine gauge wire. This approach can be particularly useful for making asymmetric concave structures, where the film would normally resist taking on an asymmetric shape.

Another approach to form the concave structures in the transflector is to place plastic pins at predetermined locations on the back side of a front diffuser plate corresponding to places at which the transflector is intended to contact or nearly contact the back reflector. During backlight assembly, the pins can contact a flexible transflective film to form the transflector, which can be attached at its edges to the backlight enclosure, into one or more concave shapes defined by the positions of the pins. Other suitable methods for forming the backlights described herein can be found, e.g., in U.S. patent application Ser. No. XX/XXX,XXX, titled METHODS OF FORMING DIRECT-LIT BACKLIGHTS HAVING LIGHT RECYCLING CAVITY WITH CONCAVE TRANSFLECTOR (Attorney Docket No. 61199US006).

Figure 8:
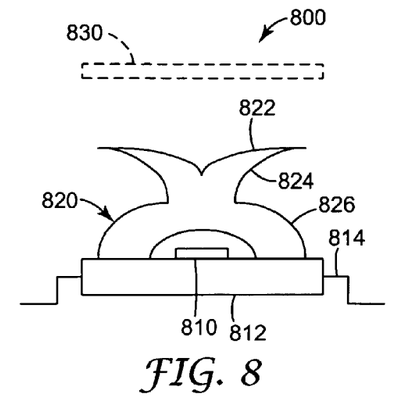
FIGS. 8-11 are schematic cross-section views of various packaged LEDs useable as light sources in the disclosed backlights.
Figure 9:
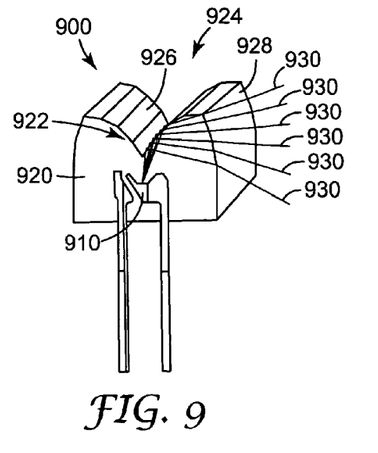
Figure 10:
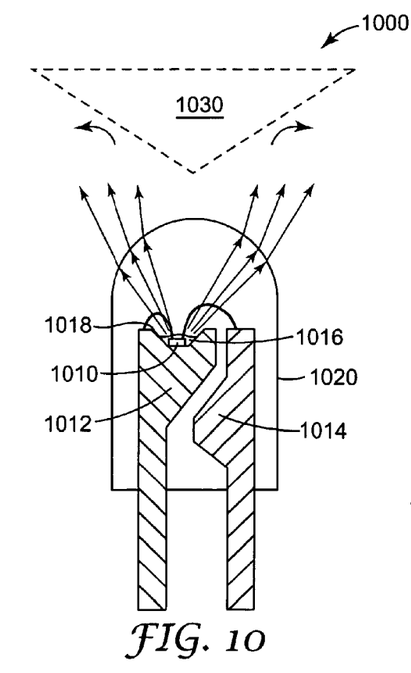
Figure 11:
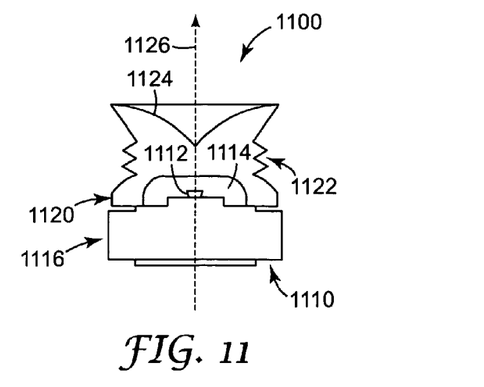

FIGS. 8-11 show views of some light sources that are useable in the disclosed backlights, but they are not intended to be limiting. The illustrated light sources include packaged LEDs. The light sources of FIGS. 8, 9, and 11 show side-emitting LED packages, where light from an LED die is reflected and/or refracted by an integral encapsulant or lens element to provide peak light emission in a generally lateral direction rather than forward along a symmetry axis of the source. The light source of FIG. 10 can be forward emitting or side-emitting, depending on whether an optional deflector is included.

In FIG. 8, a light source 800 includes an LED die 810 carried by a frame 812 and electrically connected to leads 814. Leads 814 are used to electrically and physically connect the light source 800 to a circuit board or the like. A lens 820 is attached to frame 812. The lens 820 is designed such that light emitted into an upper section of the lens is totally internally reflected on an upper surface 822 such that it is incident on a bottom surface 824 of the upper section and refracted out of the device. Light emitted into a lower section 826 of the lens is also refracted out of the device. Light source 800 can also include an optional diverter 830, such as a disk of reflective material, mounted above the lens 820 or attached to the upper surface 822. See also U.S. Patent Application Publication US 2004/0233665 (West et al.).

In FIG. 9, a light source 900 includes an LED die (not shown) mounted on a lead frame 910. A transparent encapsulant 920 encapsulates the LED die, lead frame 910, and a portion of the electrical leads. The encapsulant 920 exhibits reflection symmetry about a plane containing an LED die surface normal. The encapsulant has a depression 924 defined by curved surfaces 922. Depression 924 is essentially linear, centered on the plane of symmetry, and a reflective coating 926 is disposed on at least a portion of surface 922. Light emanating from the LED die reflects off reflective coating 926 to form reflected rays which are in turn refracted by a refracting surface 928 of the encapsulant, forming refracted rays 930. See also U.S. Pat. No. 6,674,096 (Sommers).

In FIG. 10, a light source 1000 includes an LED die 1010 disposed in a recessed reflector area 1018 of a lead frame 1012. Electrical power is supplied to the source by the lead frame 1012 and another lead frame 1014, by virtue of wire bond connections from the lead frames to the LED die 1010. The LED die 1010 has a layer of fluorescent material 1016 over it, and the entire assembly is embedded in a transparent encapsulation epoxy resin 1020 having a lensed front surface. When energized, the top surface of the LED die 1010 produces blue light. Some of this blue light passes through the layer of fluorescent material, and combines with yellow light emitted by the fluorescent material to provide a white light output. Alternately, the layer of fluorescent material can be omitted so that the light source emits only the blue light (or another color as desired) produced by the LED die 1010. In either case, the white or colored light is emitted in essentially a forward direction to produce peak light emission along a symmetry axis of the light source 1000. If desired, however, light source 1000 can optionally include a deflector 1030 having reflective surfaces to redirect light in generally sideways or lateral directions, thus converting the light source 1000 to be a side-emitter. Deflector 1030 may have mirror symmetry with respect to a plane perpendicular to the page, or may have rotational symmetry about a vertical axis coincident with a symmetry axis of the encapsulating resin 1020. See also U.S. Pat. No. 5,959,316 (Lowery).

In FIG. 11, a light source 1100 has an LED die 1112 supported by a package base 1116. A lens 1120 is coupled to base 1116, and a package axis 1126 passes through the center of base 1116 and lens 1120. The shape of lens 1120 defines a volume 1114 between LED die 1112 and lens 1120. The volume 1114 can be filled and sealed with silicone, or with another suitable agent such as a resin, air or gas, or vacuum. Lens 1120 includes a sawtooth refractive portion 1122 and a total internal reflection (TIR) funnel portion 1124. The sawtooth portion 1122 is designed to refract and bend light so that the light exits from lens 1120 as close to 90 degrees to the package axis 1126 as possible. See also U.S. Pat. No. 6,598,998 (West et al.).

In addition to the diverters depicted in FIGS. 8 and 10, the sources can utilize other diverters, including the bifunctional diverters described in commonly assigned U.S. application Ser. No. 11/458,891, entitled DIRECT-LIT BACKLIGHT HAVING LIGHT SOURCES WITH BIFUNCTIONAL DIVERTERS.

Multicolored light sources, whether or not used to create white light, can take many forms in a backlight, with different effects on color and brightness uniformity of the backlight output area. In one approach, multiple LED dies (e.g., a red, a green, and a blue light emitting die) are all mounted in close proximity to each other on a lead frame or other substrate, and then encased together in a single encapsulant material to form a single package, which may also include a single lens component. Such a source can be controlled to emit any one of the individual colors, or all colors simultaneously. In another approach, individually packaged LEDs, with only one LED die and one emitted color per package, can be clustered together for a given recycling cavity, the cluster containing a combination of packaged LEDs emitting different colors such as blue/yellow or red/green/blue. In still another approach, such individually packaged multicolored LEDs can be positioned in one or more lines, arrays, or other patterns.

Depending on the choice of light source, the back reflector, transflector, and other components of the backlight will be exposed to different amounts of UV radiation, with CCFL and HCFL sources emitting more UV radiation in general than LED sources. Hence, components of the backlight may incorporate UV absorbers or stabilizers, or may utilize materials selected to minimize UV degradation. If low UV-output sources such as LEDs are used to illuminate the backlight, UV absorbers and the like may not be necessary, and a wider selection of materials is available. In addition to UV absorbers and stabilizers, the transflector may also comprise dyes and/or pigments to adjust transmission, color, and other optical characteristics of the transflector, recycling cavity, and backlight.

All references and publications cited herein are expressly incorporated herein by reference in their entirety into this disclosure. Illustrative embodiments of this disclosure are discussed and reference has been made to possible variations within the scope of this disclosure. These and other variations and modifications in the disclosure will be apparent to those skilled in the art without departing from the scope of the disclosure, and it should be understood that this disclosure is not limited to the illustrative embodiments set forth herein. Accordingly, the disclosure is to be limited only by the claims provided below.

What is claimed is:

1. An edge-lit backlight having an output area, comprising:
   a back reflector facing the output area of the backlight;
   a transflector that partially transmits and partially reflects incident light, the transflector being shaped to form at least one concave structure facing the back reflector to provide one or more recycling cavities therebetween, wherein the one or more recycling cavities substantially fill the output area of the backlight; and
   at least one light source positioned adjacent a first edge of the backlight, wherein the at least one light source is operable to inject light into the one or more recycling cavities through an input surface of the one or more recycling cavities, wherein the input surface is substantially orthogonal to the output area of the backlight, and further wherein the at least one concave structure converges with the back reflector in a direction distal from the input surface.

2. The backlight of claim 1, further comprising an edge reflecting cavity positioned adjacent the first edge of the backlight, wherein the at least one light source is positioned to emit light within the edge reflecting cavity.

3. The backlight of claim 1, wherein each recycling cavity has a depth d and a width W, and W is at least 2.5 times d.

4. The backlight of claim 1, wherein each recycling cavity has a depth d and a width W, and W is at least 5 times d.

5. The backlight of claim 1, wherein at least one recycling cavity is hollow.

6. The backlight of claim 1, wherein the at least one concave structure consists essentially of a single concave structure, and the one or more recycling cavities consist essentially of a single recycling cavity.

7. The backlight of claim 1, wherein the at least one concave structure includes a plurality of concave structures, and the one or more recycling cavities includes a plurality of recycling cavities.

8. The backlight of claim 7, wherein the concave structures each have a concave cross-sectional profile in a first plane and a substantially flat cross-sectional profile in a second plane perpendicular to the first plane.

9. The backlight of claim 7, wherein the concave structures each have concave cross-sectional profiles in both a first and second mutually perpendicular plane.

10. The backlight of claim 7, wherein each of the recycling cavities extends across a dimension of the output area.

11. The backlight of claim 1, wherein the at least one light source comprises a plurality of LEDs.

12. The backlight of claim 11, wherein the plurality of LEDs comprises LEDs that emit in different colors.

13. The backlight of claim 11, wherein the transflector is shaped to form a plurality of concave structures facing the back reflector to provide a plurality of recycling cavities, wherein each recycling cavity comprises an input surface, and further wherein for each recycling cavity there is at least one LED disposed adjacent an edge of the backlight to inject light into the input surface of such recycling cavity.

14. The backlight of claim 1, wherein the transflector consists essentially of a film selected from the group of a semi-reflective film and a light deflecting film.

15. The backlight of claim 1, wherein the transflector includes two films selected from the group of semi-reflective films, light deflecting films, and combinations thereof.

16. The backlight of claim 1, wherein the transflector comprises a scored film.

17. The backlight of claim 1, wherein the transflector comprises a film held in compression.

18. A display system, comprising:
   a display panel comprising an illumination side and a viewing side; and
   an edge-lit backlight disposed on the illumination side of the display panel, wherein the backlight has an output area, wherein the edge-lit backlight comprises:

a back reflector facing the output area of the backlight;

a transflector that partially transmits and partially reflects incident light, the transflector being shaped to form at least one concave structure facing the back reflector to provide one or more recycling cavities therebetween, wherein the one or more recycling cavities substantially fill the output area of the backlight; and at least one light source positioned adjacent a first edge of the backlight, wherein the at least one light source is operable to inject light into the one or more recycling cavities through an input surface of the one or more recycling cavities, wherein the input surface is substantially orthogonal to the output area of the backlight, and further wherein the at least one concave structure converges with the back reflector in a direction distal from the input surface.

19. The system of claim 18, wherein the display panel comprises a liquid crystal display (LCD).

20. The system of claim 19, wherein the system comprises an LCD television.

21. An edge-lit backlight having an output area, comprising:

a back reflector;

transflector means for partially transmitting and partially reflecting incident light, the transflector means including at least one concave structure facing the back reflector to provide one or more recycling cavities therebetween, wherein the one or more recycling cavities substantially fill the output area of the panel; and light source means positioned adjacent a first edge of the backlight for injecting light into the one or more recycling cavities through an input surface of the one or more recycling cavities, wherein the input surface is substantially orthogonal to the output area of the backlight, and further wherein the input surface is substantially orthogonal to the output area;

wherein the at least one concave structure converges with the back reflector in a direction distal from the input surface.

* * * * *